(12) United States Patent
Yang

(10) Patent No.: US 8,530,147 B2
(45) Date of Patent: Sep. 10, 2013

(54) PATTERNING PROCESS

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 558 days.

(21) Appl. No.: 11/943,919

(22) Filed: Nov. 21, 2007

(65) Prior Publication Data

US 2009/0130612 A1    May 21, 2009

(51) Int. Cl.
*G03F 7/26* (2006.01)
*G03F 7/40* (2006.01)

(52) U.S. Cl.
USPC .......................................... 430/323; 430/330

(58) Field of Classification Search
USPC ................ 430/311, 322, 323, 330, 327
See application file for complete search history.

(56) References Cited

U.S. PATENT DOCUMENTS

| | | | |
|---|---|---|---|
| 6,593,063 B1 * | 7/2003 | Tanaka et al. | 430/311 |
| 6,919,161 B2 | 7/2005 | Hatakeyama et al. | |
| 2004/0009436 A1 | 1/2004 | Lee et al. | |
| 2005/0130068 A1 * | 6/2005 | Kondoh et al. | 430/312 |
| 2007/0037410 A1 | 2/2007 | Chang et al. | |
| 2007/0077524 A1 * | 4/2007 | Koh et al. | 430/314 |
| 2008/0261384 A1 * | 10/2008 | Sun et al. | 438/514 |

FOREIGN PATENT DOCUMENTS

| | | | |
|---|---|---|---|
| KR | 10-2007-0004234 | * | 1/2007 |
| TW | I 225971 | | 1/2005 |
| TW | I 245774 | | 12/2005 |

OTHER PUBLICATIONS

English translation of KR 10-2007-0004234, Jan. 2007.*

* cited by examiner

*Primary Examiner* — Brittany Raymond
(74) *Attorney, Agent, or Firm* — J.C. Patents

(57) ABSTRACT

The invention is directed to a method for patterning a material layer. The method comprises steps of forming a first mask layer on the material layer and then patterning the first mask layer. The patterned first mask layer has a pattern therein and a plurality of gaps within the patterns and the gaps expose a portion of the material layer. Further, a second mask layer is formed over the material layer and the second mask layer fills the gaps. An interface layer is formed between the patterned first mask layer and the second mask layer. A portion of the second material layer is removed until the top surface of the interface layer is exposed. The interface layer is removed to expose a portion of the material layer and the material layer is patterned by using the patterned first mask layer and the second mask layer as a mask.

20 Claims, 6 Drawing Sheets

PATTERNING PROCESS

BACKGROUND OF THE INVENTION

1. Field of Invention

The present invention relates to a method for forming a semiconductor device. More particularly, the present invention relates to a method for patterning a material layer.

2. Description of Related Art

In the manufacture of integrated circuit, photolithography process is used to transfer patterns from a photo mask having customized circuit patterns to thin films formed on a wafer. The image transfer process comprises steps of forming a photoresist layer on a material layer, illuminating the photoresist layer through a photomask having the customized circuit patterns, developing the photoresist layer and then etching the material layer by using the patterned photoresist layer as a mask. Hence, the image transfer process is accomplished. For a well-manufactured integrated circuit product, the image transfer process mentioned above is performed several times to transfer the circuit patterns to each non-process layers to form the electrically circuit device.

Conventionally, in order to increase the integration of the device elements without being limited by the resolution of the optical tool, a double patterning process is developed. In the double patterning process, a mask layer is formed on the material layer and is patterned twice with using different photomasks. On the other words, the formation of photoresist layer, the exposure-developing process and the etching process for patterning the mask layer are repeatedly in sequence to transfer two different patterns into the mask layer. Then, by using the patterned mask layer, the material layer is pattern so as to transfer the pattern on the patterned mask layer into the material layer. Thus, the pattern in the mask layer possesses smaller pitch than the patterns of the photomasks. However, in the conventional double patterning process, the etching process should be performed several times. Therefore, the process procedure is complex and the throughput is decreased.

SUMMARY OF THE INVENTION

Accordingly, the present invention is to provide a method for patterning a material layer capable of providing relatively easy manufacturing procedure and decreasing manufacturing cost.

The present invention also provides a method for patterning a material layer without performing the photolithography process more than once and capable of simplifying the manufacturing procedure.

The invention provides a method for patterning a material layer. The method comprises steps of forming a first mask layer on the material layer and then patterning the first mask layer. The patterned first mask layer has a pattern therein and a plurality of gaps within the patterns and the gaps expose a portion of the material layer. Further, a second mask layer is formed over the material layer and the second mask layer fills the gaps. An interface layer is formed between the patterned first mask layer and the second mask layer. A portion of the second material layer is removed until the top surface of the interface layer is exposed. The interface layer is removed to expose a portion of the material layer and the material layer is patterned by using the patterned first mask layer and the second mask layer as a mask.

According to one embodiment of the present invention, the first mask layer is made of negative photoresist and the second mask layer is made of positive photoresist.

According to one embodiment of the present invention, the patterned first mask layer has a plurality of acidic ions therein. Also, the step of forming the interface layer comprises steps of diffusing a portion of the acidic ions form the patterned first mask layer into a portion of the second mask layer near the interface between the patterned first mask layer and the second mask layer and then transferring the portion of the second mask layer having acidic ions therein into the interface layer. Further, the temperature for forming the interface layer is about 80-140° C. and the time for forming the interface layer is about 60-150 seconds.

According to one embodiment of the present invention, the interface layer is made of developer-soluble material which can be dissolved in a developer.

According to one embodiment of the present invention, the method for removing the interface layer includes wet etching.

The present invention further provides a method for patterning a material layer. The method comprises steps of forming a first mask layer with a pattern on the material layer, wherein the first mask layer has a plurality of gaps between the pattern. A second mask layer is formed over the material layer to fill the gaps and a thermal process is performed for changing a chemical structure of a portion of the second mask layer adjacent to the interface between the first mask layer and the second mask layer so as to transform the portion of the second mask layer to be a developer-soluble layer. The second mask layer is etched back until the top surface of the developer-soluble layer is exposed. The developer-soluble layer is dissolved in a developer to expose a portion of the material layer and the material layer is patterned by using the first mask layer and the second mask layer as a mask.

According to one embodiment of the present invention, the first mask layer is made of post-exposure negative photoresist and the second mask layer is made of positive photoresist.

According to one embodiment of the present invention, the first mask layer has a plurality of acidic ions therein. Further, the step of forming the developer-soluble layer during the thermal process comprises steps of diffusing a portion of the acidic ions form the first mask layer into a portion of the second mask layer adjacent to the interface between the patterned first mask layer and the second mask layer and transforming the portion of the second mask layer having acidic ions therein into the developer-soluble layer. Also, the temperature for forming the developer-soluble layer is about 80-140° C. and the time for forming the developer-soluble layer is about 60-150 seconds.

The present invention also provides a method for patterning a material layer. The method comprises steps of forming a first mask layer having a pattern on the material layer, wherein the first mask layer has a plurality of acidic ions distributing on the surface thereof. A pre-polymerization layer is formed on the first mask layer and a thermal process is performed to diffuse the acidic ions from the surface of the first mask layer into the pre-polymerization layer so as to polymerize a portion of the pre-polymerization layer around the first mask layer to be a polymerization layer. The rest portion of the pre-polymerization layer is removed and a second mask layer is formed to fill a plurality of gaps between the pattern in the first mask layer. A portion of the second mask layer is removed until the top surfaces of the first mask layer and the polymerization layer are exposed and the polymerization layer is removed until a portion of the material layer is exposed. The material layer is patterned by using the first mask layer and the second mask layer as a mask.

According to one embodiment of the present invention, the material of the first mask layer is as same as the material of the second mask layer.

According to one embodiment of the present invention, the etching selectivity of the first mask layer relative to the polymerization layer is similar to the etching selectivity of the second mask layer relative to the polymerization layer.

According to one embodiment of the present invention, the material of the pre-polymerization layer is resolution-enhancement-lithography-assist-by-chemical-shrink (RELACS) material or acid-catalyst negative photoresist.

According to one embodiment of the present invention, the material of the second mask layer is silicon-containing polymer, silicon-containing bottom anti-reflective coating (BARC) or silicon-containing photoresist.

According to one embodiment of the present invention, the material of the first mask layer is silicon-containing positive photoresist.

According to one embodiment of the present invention, the temperature of the thermal process is about 80-140° C.

According to one embodiment of the present invention, the time for performing the thermal process is about 60-150 seconds.

In the present invention, by controlling the formation of the interface layer/developer-soluble layer/polymerization layer between the first mask layer and the second mask layer, the pitch of the device formed from the material layer by using the first mask layer and the second mask layer as a mask is reduced and is even smaller than the optical resolution of the tool for forming the pattern in the first mask layer. Furthermore, the photolithography process is performed only once when the first mask layer and the second mask layer is formed. Therefore, the pitch reduction can be reached without repeatedly performing the photolithography process. Thus, the manufacturing process is relatively simple and the cost is decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
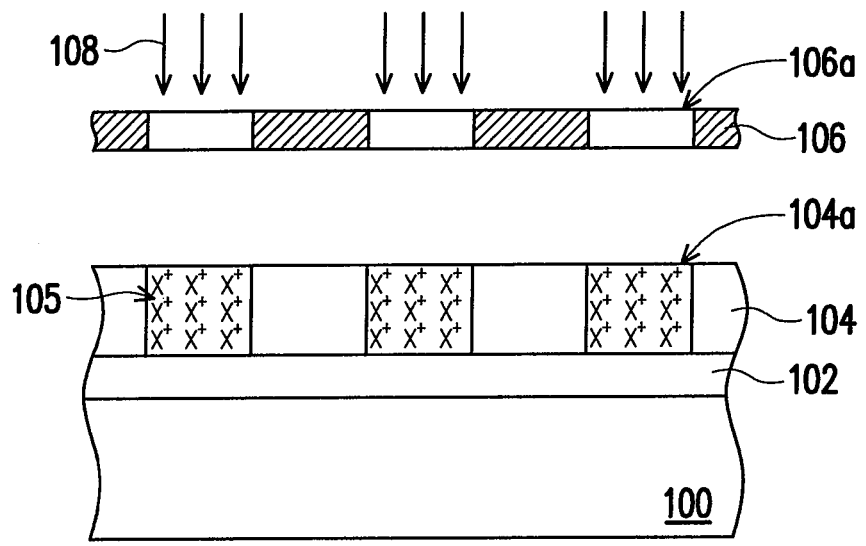
FIGS. 1A through 1F are schematic diagrams illustrating a method for patterning a material layer according to one embodiment of the present invention.
Figure 1B:
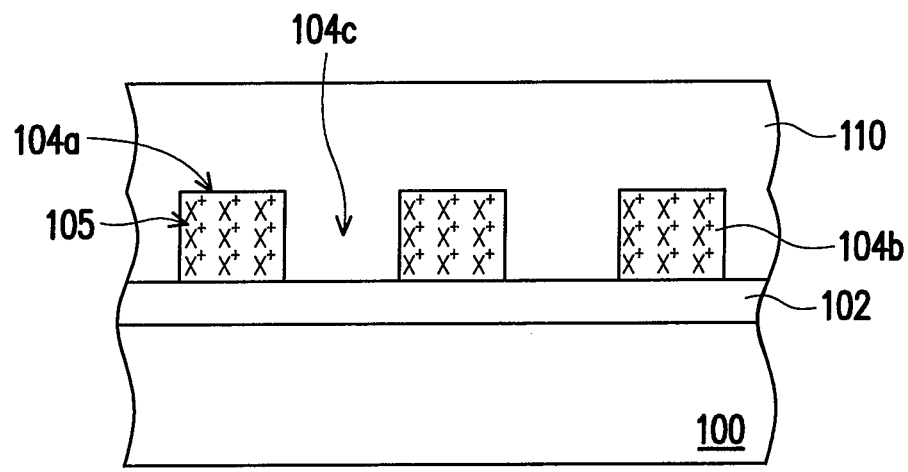

FIGS. 1A through 1F are schematic diagrams illustrating a method for patterning a material layer according to one embodiment of the present invention. As shown in FIG. 1A, a substrate 100 having a material layer 102 formed thereon is provided. It should be noticed that there are several interconnect layers (not shown) formed between the substrate 100 and the material layer 102, and the interconnect layers are not detail described herein. Then, a first mask layer 104 is formed over the substrate 100. Thereafter, an exposure process 108 is performed with the use of the photomask 106 having a pattern 106a. Hence, the pattern 106a of the photomask 106 is transformed into the first mask layer 104 as a pattern 104a. As shown in FIG. 1B, a develop process is performed to remove the unexposed portion of the first mask layer 104 and the exposed portion of the first mask layer 104, which is labeled 104b in FIG. 1B, remains on the material layer 102. In the present embodiment, the first mask layer 104 can be, for example but not limited to, made of negative photoresist. Therefore, after the exposure process and the develop process, the exposed portion of the first mask layer remains on the material layer. Meanwhile, according to the characters of the negative photoresist, the negative photoresist would produce a lot of acidic ions to catalyze the polymerization of the negative photoresist so that the exposed portion of the negative photoresist is difficult to be dissolved in the developer. Accordingly, the exposed portion of the first mask layer 104b possesses a lot of acidic ions 105 therein. However, the material of the first mask layer and the way to form the first mask layer 104b having a pattern 104a and a plurality of acidic ions 105 therein is not limited by the descriptions made above. That is, the material of the first mask layer can be varied and the method for patterning the first mask layer can be varied as well as long as the patterned first mask layer has the ability to change the chemical structure of the later formed second mask layer.

As shown in FIG. 1B, after the first mask layer is patterned, there are gaps 104c between the pattern 104a of the first mask layer 104b and the gaps 104c expose a portion of the material layer 102. Then, a second mask layer 110 is formed over the material layer 102 and the second mask layer 110 fills the gaps 104c. The material of the second mask layer 110 can be, for example but not limited to, positive photoresist. According to the characters of the positive photoresist, the chemical structure of the positive photoresist changes to be dissolved in the developer after it is exposed and the acidic ions catalyze the change of the chemical structure of the positive photoresist. More clearly, the material of the second mask layer should be the material whose chemical structure changes to be soluble in the developer or wet etching etchant as it is in contact with the first mask layer.

Figure 1C:
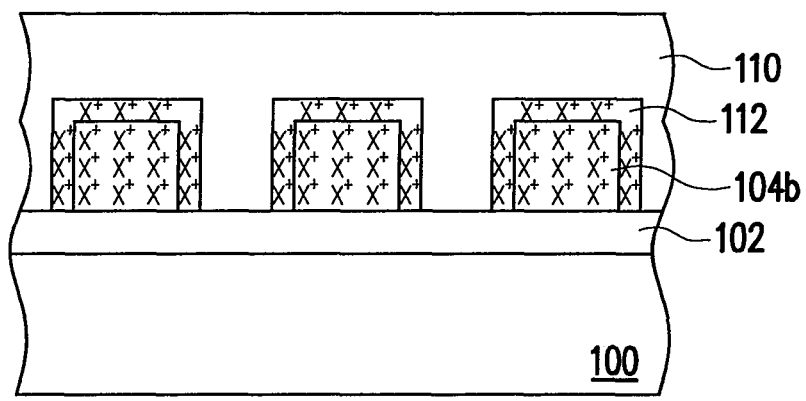

As shown in FIG. 1C, a thermal process is performed so that a portion of the second mask layer 110 near the interface between the first mask layer 104b and the second mask layer 110 is transformed into an interface layer 112. During the thermal process, a portion of the acidic ions 105 within the first mask layer 104b diffuse into a portion of the second mask layer 110 near the interface between the first mask layer 104b and the second mask layer 110 to trigger and to catalyze the change of the chemical structure of the portion of the second mask layer 110 so as to transform the portion of the second mask layer 110 into a developer-soluble layer 112, that is the interface layer 112. On the other words, as the first mask layer 104b is made of negative photoresist after being exposed and the second mask layer 110 is made of positive photoresist, the acidic ions 105 in the first mask layer after being exposed diffuse into the portion of the second mask layer 110 to change the chemical structure of the portion of the second mask layer 110 so that the portion of the second mask layer 110 is transformed into the interface layer 112 which can be dissolved in the liquid type solution such as developer. Moreover, the temperature for performing the thermal process for forming the interface layer 112 is about 80-140° C. Further, the time for performing the thermal process for forming the interface layer 112 is about 60-150 seconds. Also, the thermal process can be, for example but not limited to, a post exposure baking process.

Figure 1D:
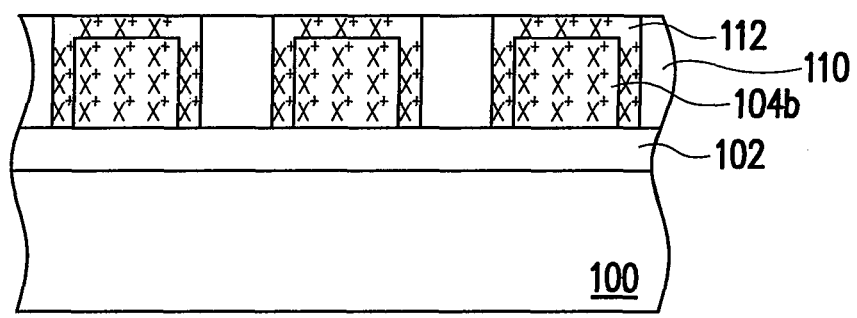
Figure 1E:
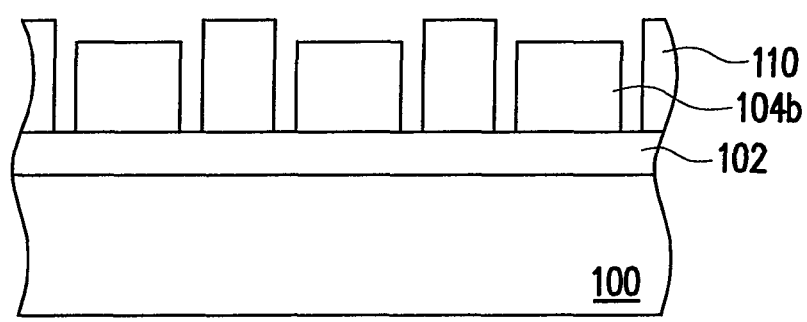
Figure 1F:
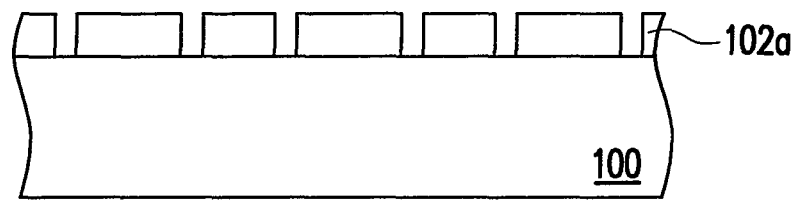

As shown in FIG. 1D, a portion of the second mask layer 110 is removed until a top surface of the interface layer 112 is exposed. The method for removing the portion of the mask layer 110 can be, for example but not limited to, etching back such as anisotropic etching process. As shown in FIG. 1E, the interface layer 112 is removed to expose a portion of the material layer 102. The method for removing the interface layer 112 includes wet etching. In one embodiment, the interface layer 112 can be removed by using the developer. On the other words, the interface layer 112 is dissolved in the developer. After the interface layer 112 is removed, a portion of the material layer 102 is exposed. As shown in FIG. 1F, the material layer 102 is patterned by using the first mask layer 104b and the second material layer 110 as a mask.

In this embodiment of the present invention, the first mask layer and the second mask layer are formed over the material layer in sequence and the interface layer is formed by changing the chemical structure of a portion of the second mask layer. By forming the second mask layer filling the gaps between the pattern in the first mask layer and by forming the developer-soluble layer 112 between the first mask layer and the second mask layer, the pitch of the patterned material layer 102a (as shown in FIG. 1F) is smaller than the exposure tool resolution. Thus, the pitch of the device is reduced.

Figure 2A:
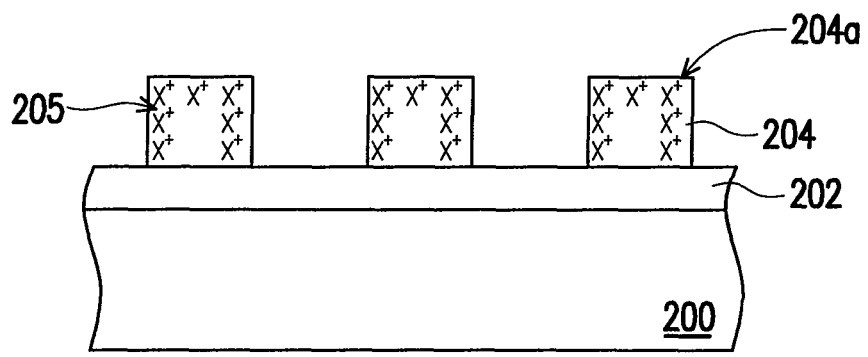
FIGS. 2A through 2F are schematic diagrams illustrating a method for patterning a material layer according to another embodiment of the present invention.

In the previous embodiment, the interface layer 112 is formed from a portion of the second mask layer around the surface of the first mask layer. Moreover, the chemical structure of the interface layer 112 is similar to that of the post exposure positive photoresist and the interface layer 112 can be dissolved in the developer. However, the pitch reduction in the present invention is not limited by the manufacturing method of the interface layer mentioned above. FIGS. 2A through 2F are schematic diagrams illustrating a method for patterning a material layer according to another embodiment of the present invention. In the following embodiment, another pitch reduction method based on the formation of an interface layer between the first mask layer and the second layer is introduced. As shown in FIG. 2A, a substrate 200 having a material layer 202 is provided. It should be noticed that there are several interconnect layers (not shown) formed between the substrate 200 and the material layer 202, and the interconnect layers are not detail described herein. Then, a first mask layer 204 having a pattern 204a is formed on the material layer 202. It should be noticed that, the first mask layer 204 has a plurality of acidic ions 205 distributing on the surface thereof. The first mask layer 204 can be, for example but not limited to, made of silicon-containing positive photoresist. According to the characters of the positive photoresist, the chemical structure of the positive photoresist changes to be dissolved in the developer after it is exposed and the acidic ions catalyze the change of the chemical structure of the positive photoresist. Therefore, when the first mask layer 204 is made of positive photoresist, there are acidic ions distributed on the surface of the first mask layer after the exposed portion with a mass of acidic ions therein is removed by the developer.

Figure 2B:
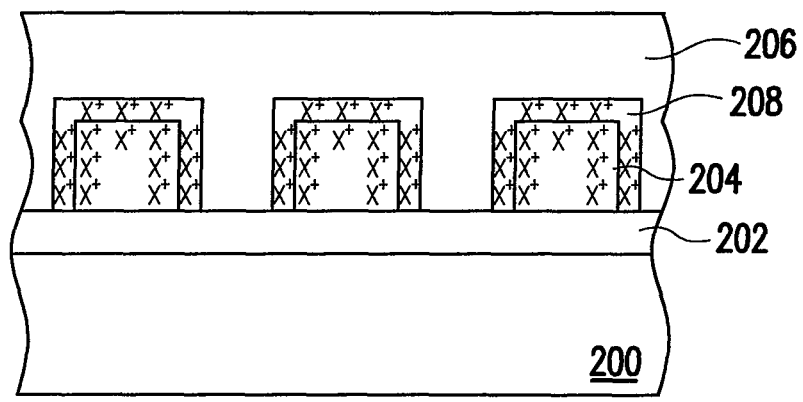

Thereafter, as shown in FIG. 2B, a pre-polymerization layer 206 is formed on the first mask layer 204. The material of the pre-polymerization layer 206 can be, for example, resolution-enhancement-lithography-assist-by-chemical-shrink (RELACS) material or acid-catalyst negative photoresist. That is, the material of the pre-polymerization layer 206 should be the material which can be polymerized as it is in contact with the first mask layer 204.

Still, as shown in FIG. 2B, a thermal process is performed to diffuse the acidic ions 205 from the surface of the first mask layer 204 into the pre-polymerization layer 206 so as to polymerize a portion of the pre-polymerization layer 206 around the first mask layer 204 to be a polymerization layer 208. The time for performing the thermal process is about 60-150 seconds. Further, the temperature of the thermal process is about 80-140° C.

Figure 2C:
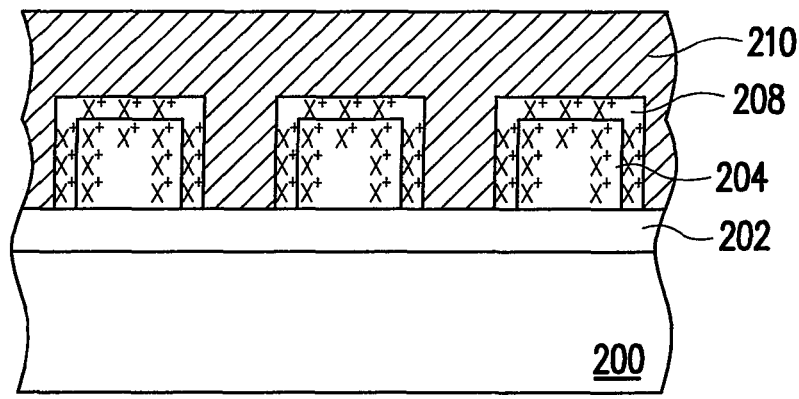

As shown in FIG. 2C, the rest portion of the pre-polymerization layer 206 is removed. The method for removing the pre-polymerization layer 206 can be, for example but not limited to, wet cleaning or wet etching. When the pre-polymerization layer 206 is made of RELACS, the pre-polymerization layer 206 can be removed by water. Further, when the pre-polymerization layer 206 is made of acid-catalyst negative resist, the pre-polymerization layer 206 can be removed by organic-based solvent.

Moreover, as shown in FIG. 2C, a second mask layer is formed to cover the first mask layer 204 and the substrate 200 and to fill the gaps between the pattern 204a in the first mask layer 204. The material of the second mask layer 210 can be, for example but not limited to, silicon-containing polymer, silicon-containing bottom anti-reflective coating (BARC) or silicon-containing photoresist. It should be noticed that the material of the first mask layer 204 can be similar to or even as same as the material of the second mask layer 210. Additionally, the etching selectivity of the first mask layer 204 relative to the polymerization layer 208 is similar to the etching selectivity of the second mask layer 210 relative to the polymerization layer 208.

Figure 2D:
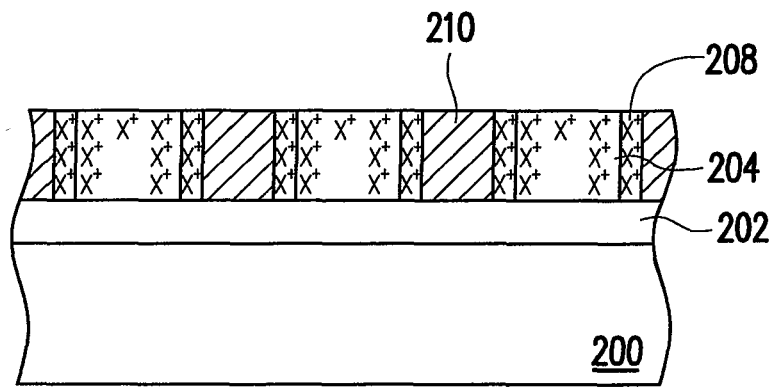
Figure 2E:
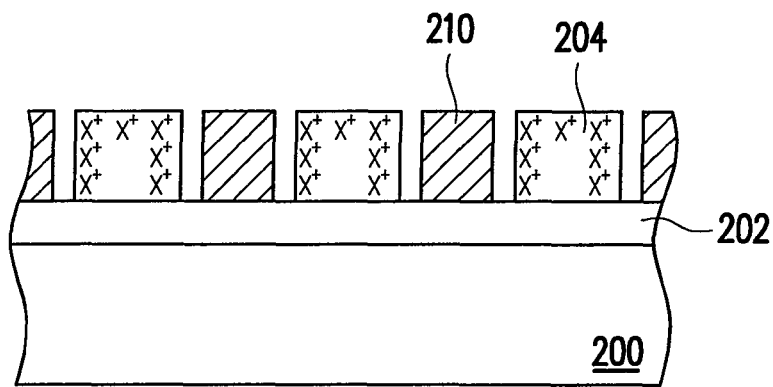

As shown in FIG. 2D, a portion of the second mask layer 210 is removed until the top surfaces of the first mask layer 204 and the polymerization layer 208 are exposed. The method for removing a portion of the second mask layer 210 can be etching back such as anisotropic etching process. Then, as shown in FIG. 2E, the polymerization layer 208 is removed until a portion of the material layer is exposed by the first mask layer 204 and the second mask layer 210. The method for removing the polymerization layer 208 can be, for example but not limited to, dry etching process such as plasma etching process.

Figure 2F:
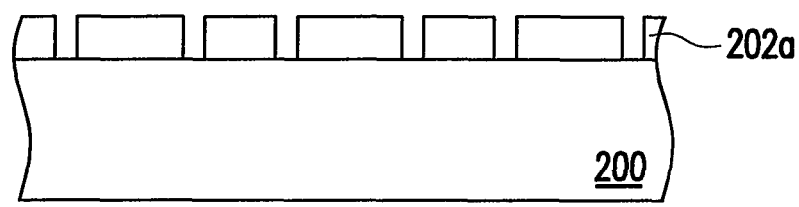

As shown in FIG. 2F, the material layer 202 is patterned by using the first mask layer 204 and the second mask layer 210 as a mask. In this embodiment of the present invention, the pre-polymerization layer is formed on the surface of the first mask layer and is polymerized through the acidic ions diffusing from the first mask layer 204. By forming the second mask layer filling the gaps between the pattern in the first mask layer and by removing the polymerization layer between the first mask layer and the second mask layer, the pitch of the patterned material layer 202a (as shown in FIG. 2F) is smaller than the exposure tool resolution. Thus, the pitch of the device is reduced.

In the present invention, by controlling the formation of the interface layer/polymerization layer between the first mask layer and the second mask layer, the pitch of the device formed from the material layer by using the first mask layer and the second mask layer as a mask is reduced and is even smaller than the optical resolution of the tool for forming the pattern in the first mask layer. Furthermore, the photolithography process is performed only once when the first mask layer and the second mask layer is formed. Therefore, the pitch reduction can be reached without repeatedly performing the photolithography process. Thus, the manufacturing process is relatively simple and the cost is decreased.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for patterning a material layer consisting of:
    forming an unpatterned first mask layer on the material layer;
    exposing and developing for patterning the unpatterned first mask layer to form a patterned first mask layer, wherein the patterned first mask layer has a plurality of patterns therein and a plurality of gaps within the patterns and the gaps expose a portion of the material layer directly followed by forming a second mask layer over the material layer, wherein the second mask layer fills the gaps;
    after the second mask layer is formed, performing a treatment to the second mask layer so as to form an interface layer between and directly contacting the patterned first mask layer and the second mask layer;
    removing a portion of the second mask layer until the top surface of the interface layer is exposed to remain a rest of the second mask layer;
    removing the interface layer to expose a portion of the material layer while the rest of the second mask layer and the patterned first mask layer remain; and
    patterning the material layer by using the patterned first mask layer and the rest of the second mask layer as a mask.

2. The method of claim 1, wherein the unpatterned first mask layer is made of negative photoresist and the second mask layer is made of positive photoresist.

3. The method of claim 1, wherein the patterned first mask layer has a plurality of acidic ions therein.

4. The method of claim 3, wherein the step of forming the interface layer consists of:
    diffusing a portion of the acidic ions form the patterned first mask layer into a portion of the second mask layer near the interface between the patterned first mask layer and the second mask layer; and
    transferring the portion of the second mask layer having acidic ions therein into the interface layer.

5. The method of claim 4, wherein the temperature for forming the interface layer is about 80-140° C.

6. The method of claim 4, wherein the time for forming the interface layer is about 60-150 seconds.

7. The method of claim 1, wherein the interface layer is made of developer-soluble material which can be dissolved in a developer.

8. The method of claim 1, wherein the method for removing the interface layer includes wet etching.

9. A method for patterning a material layer, consisting of:
    exposing and developing for patterning an unpatterned first mask layer on the material layer to form a patterned first mask layer, wherein the patterned first mask layer has a plurality of patterns therein and a plurality of gaps between the pattern directly followed by forming a second mask layer over the material layer to fill the gaps;
    after the second mask layer is formed, performing a thermal process for changing a chemical structure of a portion of the second mask layer adjacent to the interface between and directly contacting the patterned first mask layer and the second mask layer so as to transform the portion of the second mask layer to be a developer-soluble layer;
    etching back a portion of the second mask layer until the top surface of the developer-soluble layer is exposed to remain a rest of the second mask layer;
    dissolving the developer-soluble layer in a developer to expose a portion of the material layer while the rest of the second mask layer and the patterned first mask layer remain; and
    patterning the material layer by using the patterned first mask layer and the rest of the second mask layer as a mask.

10. The method of claim 9, wherein the unpatterned first mask layer is made of post-exposure negative photoresist and the second mask layer is made of positive photoresist.

11. The method of claim 9, wherein the unpatterned first mask layer has a plurality of acidic ions therein.

12. The method of claim 11, wherein the step of forming the developer-soluble layer during the thermal process consists of:
    diffusing a portion of the acidic ions form the patterned first mask layer into a portion of the second mask layer adjacent to the interface between the patterned first mask layer and the second mask layer; and
    transforming the portion of the second mask layer having acidic ions therein into the developer-soluble layer.

13. The method of claim 12, wherein the temperature for forming the developer-soluble layer is about 80-140° C.

14. The method of claim 12, wherein the time for forming the developer-soluble layer is about 60-150 seconds.

15. A method for patterning a material layer consisting of:
    forming an unpatterned first photoresist layer on the material layer;
    exposing and developing for patterning the unpatterned first photoresist layer to form a patterned first photoresist layer, wherein the patterned first photoresist layer has a plurality of patterns therein and a plurality of gaps within the patterns and the gaps expose a portion of the material layer directly followed by forming a second photoresist layer over the material layer, wherein the second photoresist layer fills the gaps;
    after the second photoresist layer is formed, performing a treatment to the second photoresist layer so as to form an interface layer between and directly contacting the patterned first photoresist layer and the second photoresist layer;
    removing a portion of the second photoresist layer until the top surface of the interface layer is exposed to remain a rest of the second photoresist layer;
    removing the interface layer to expose a portion of the material layer while the rest of the second photoresist layer and the first photoresist layer remain; and
    patterning the material layer by using the patterned first photoresist layer and the rest of the second photoresist layer as a mask.

16. The method of claim 15, wherein the patterned first photoresist layer has a plurality of acidic ions therein, and the step of forming the interface layer consists of:
    diffusing a portion of the acidic ions form the patterned first photoresist layer into a portion of the second photoresist layer near the interface between the patterned first photoresist layer and the second photoresist layer; and
    transferring the portion of the second photoresist layer having acidic ions therein into the interface layer.

17. The method of claim 16, wherein the temperature for forming the interface layer is about 80-140° C.

18. The method of claim 17, wherein the time for forming the interface layer is about 60-150 seconds.

19. The method of claim 15, wherein the interface layer is made of developer-soluble material which can be dissolved in a developer.

20. The method of claim 15, wherein the method for removing the interface layer includes wet etching.

\* \* \* \* \*